United States Patent [19]
Schmitt et al.

[11] 3,973,145
[45] Aug. 3, 1976

[54] WEATHER RADAR TRANSISTORIZED PULSE MODULATOR

[75] Inventors: Jerry C. Schmitt, Spring Hill; Terry K. Michie, Olathe, both of Kans.

[73] Assignee: King Radio Corporation, Olathe, Kans.

[22] Filed: Jan. 14, 1974

[21] Appl. No.: 432,860

[52] U.S. Cl. .................. 307/263; 307/264; 328/59; 328/65; 328/67
[51] Int. Cl.² .................. H03K 5/12; H03F 1/36; H03K 1/14
[58] Field of Search .................. 328/59, 65–68, 328/63; 307/106, 260, 264, 263; 331/87

[56] References Cited
UNITED STATES PATENTS

| | | | |
|---|---|---|---|
| 2,737,586 | 3/1956 | Flower | 331/87 |
| 2,864,058 | 12/1958 | Fredrick | 331/87 |
| 2,955,263 | 10/1960 | Hobrough | 328/59 |
| 3,090,921 | 5/1963 | Boles et al. | 328/65 |
| 3,166,721 | 1/1965 | Smith | 331/87 |
| 3,168,648 | 2/1965 | Clausen et al. | 307/264 |
| 3,184,615 | 5/1965 | Stover | 307/260 |
| 3,244,904 | 4/1966 | Schwartz | 307/264 |
| 3,374,443 | 3/1968 | Braum et al. | 331/87 |
| 3,383,523 | 5/1968 | Hurlimann | 331/87 |
| 3,393,368 | 7/1968 | Coyle | 328/67 |
| 3,424,925 | 1/1969 | Gagliardi et al. | 307/264 |

*Primary Examiner*—Stanley D. Miller, Jr.
*Attorney, Agent, or Firm*—Lowe, Kokjer, Kircher et al.

[57] ABSTRACT

A transistorized active switch radar pulse modulator has a unique means for pulse current control which includes a transformer interconnected with a magnetron. Transistor switches and related circuitry pulse a step up transformer with voltage pulses to drive the magnetron with a desired current pulse having the appropriate shape and width. A capacitor in the secondary of the transformer acts as a load to the transformer prior to the conduction level of the magnetron so that no current transients occur after the magnetron fires. Suitable protective features operate to sense an arcing condition and to dissipate the arcing effects. A unique slope control circuit insures that the requisite flat current pulse drives the magnetron.

2 Claims, 4 Drawing Figures

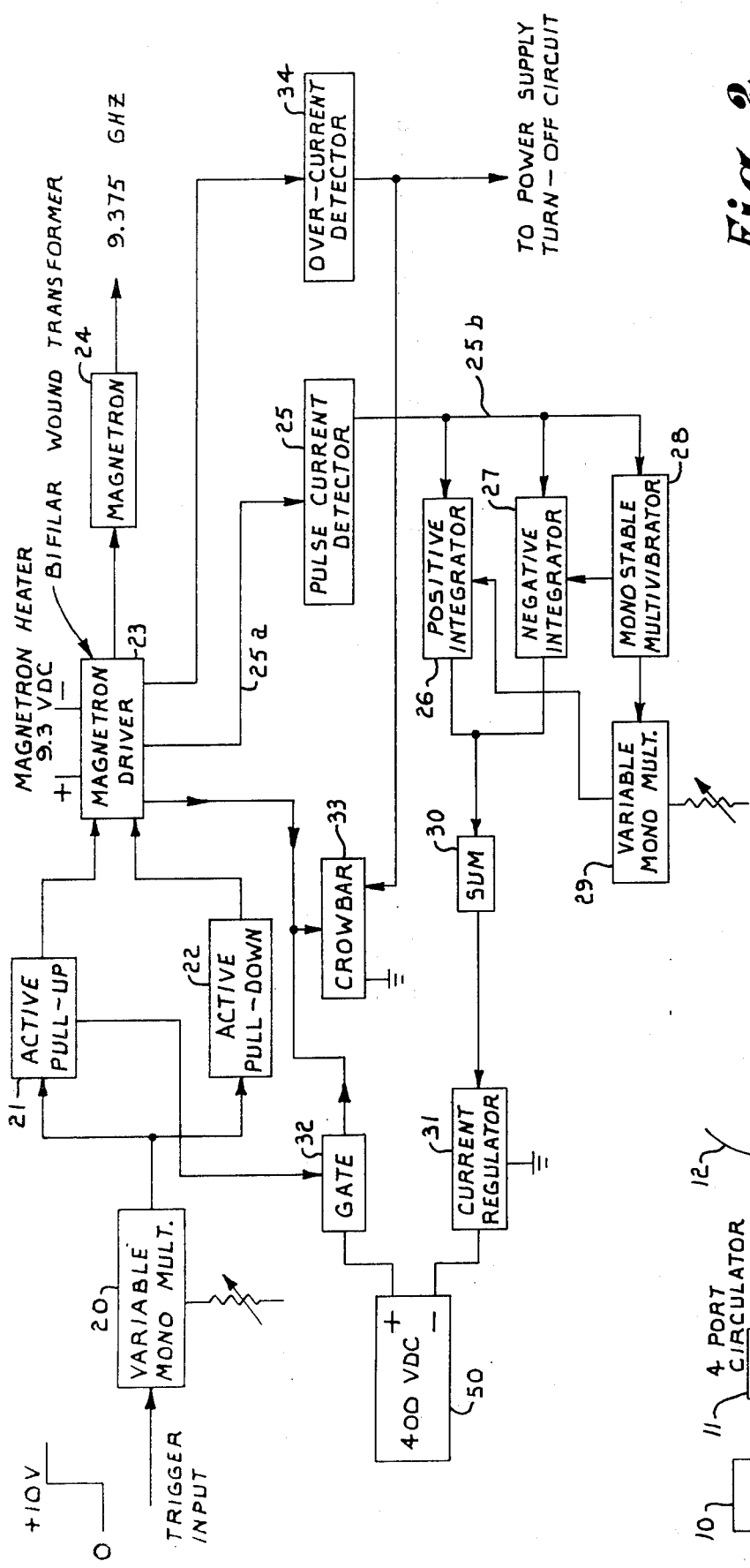

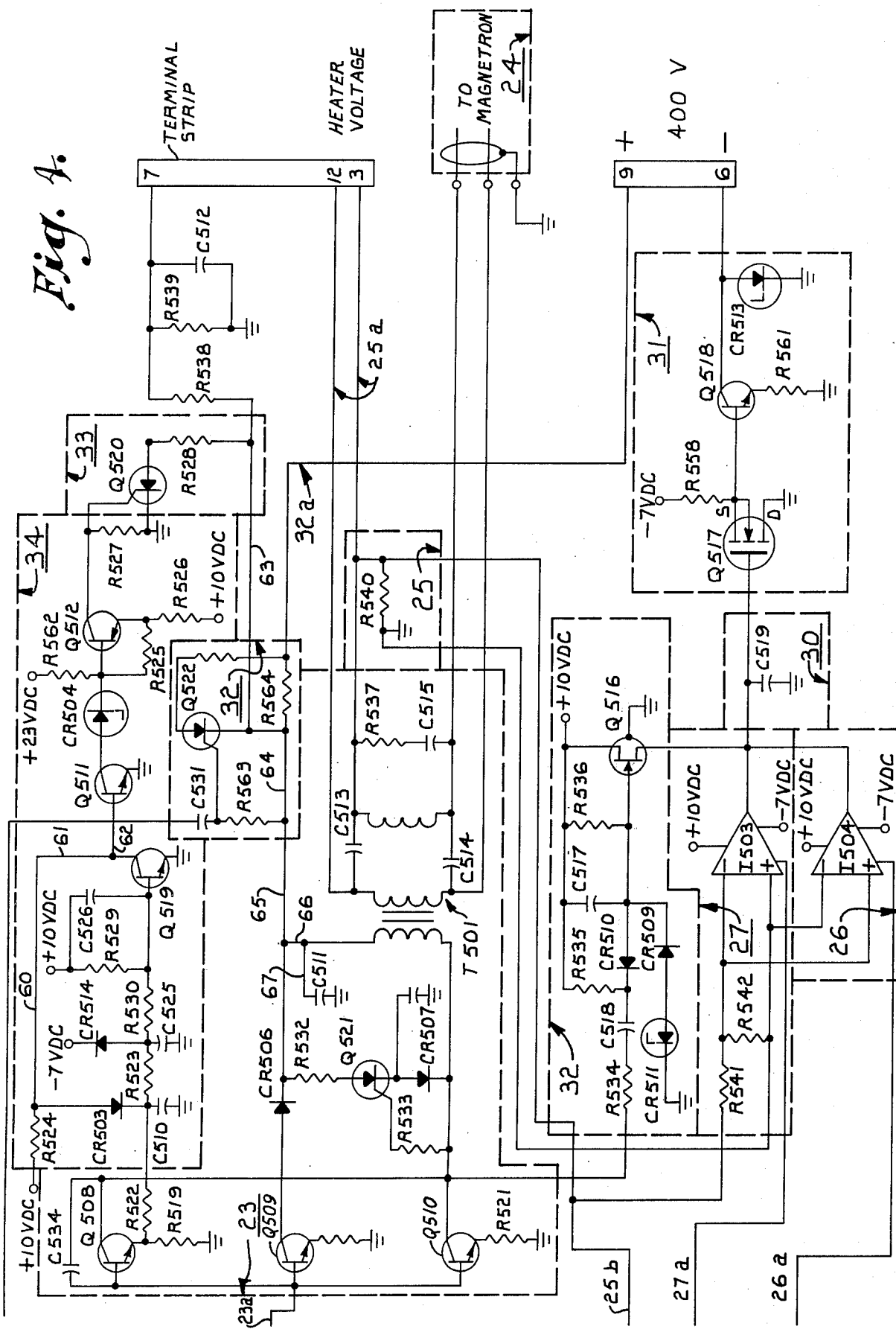

WEATHER RADAR TRANSISTORIZED PULSE MODULATOR

BACKGROUND AND BRIEF DESCRIPTION OF THE INVENTION

A block diagram of a typical state of the art weather radar is shown in FIG. 1 and will include a transmitter 10 comprising a pulse modulator coupled with a magnetron. The pulse modulator essentially modulates the magnetron causing same to emit a short burst of microwave energy corresponding to the transmitted pulse. These pulses are coupled through a four port circulator 11, that permits the transmitted pulses to go to antenna 12 without coupling same to the receiver 13. However, when the return pulses are received by the antenna, the four port circulator permits reception of the received pulses by the receiver 13 and will not deliver the pulse to the transmitter 10. In any event, the transmitted pulse is radiated by the parabolic dish portion of the antenna 12 generally from the nose of an aircraft toward possible weather. The received reply will be indicative of the presence of rain in cloud formations in the direction the antenna is pointing.

Once the four port circulator delivers the received pulses to the receiver, the information is detected into a low frequency video signal and transmitted to the indicator 15 on the "video" line. Indicator 15 also takes trigger information indicative of the starting of the transmitter pulse from transmitter 10 on the trigger pulse line 14. This trigger pulse informs the indicator as to the instant in time of pulse transmission so that the indicator can gauge time with respect to same for calculating range, etc. Furthermore, the indicator couples the detected return pulses with the trigger pulses and azimuth information from the antenna thereby providing a visual indication of the antenna scanning position with respect to azimuth.

The subject invention, while pertaining generally to weather radars, is more particularly directed to the pulse modulator portion of the associated transmitter. Known prior art radar pulse modulators generally fall into three basic types: e.g., line-type, magnetic and active switch. The line-type and magnetic modulators use pulse forming networks (PFN) coupled with a charging circuit and a switching element to drive the load (a magnetron or other microwave RF tubes). The shape and duration of the pulse produced by modulators is determined by passive circuit elements which present severe design and manufacturing limitations in that the pulse repetition frequency (PRF) corresponds to reset and charging time. Further, the pulse duration cannot be readily changed (long pulse durations require large PFNs) and pulse flatness and ripple are generally hard to control. The use of resonant delay lines in combination with saturating step up transformers (in addition to being difficult to control) are expensive and require a high degree of skill in manufacturing and assembling.

As will be described, the subject modulator is non-resonant and capable of being constructed of relatively low cost generally off the shelf items that do not require difficult and time consuming assembly techniques. The nature of the operative environment (weather radar) suggests the utilization of certain components such as magnetrons for the RF pulse producing circuit. Accordingly, the utilization of a transistor switch and a step up transformer for driving a magnetron along with the associated circuitry comprise an important feature of the subject invention.

The subject invention, including the transistorized active switch pulse modulator, provides superior performance over known prior art devices in that the pulse repetition frequency and pulse duration can be readily changed. Very long RF pulses are now limited only by storage capacitance, transformer saturation and associated magnetron limitations. Further, the pulse ripple will be quite low and the pulse slope is automatically regulated by a unique feedback network in order to maintain the desired RF pulse frequency spectrum.

One of the principal objects of the invention is to provide a uniquely constructed circuit and method for producing pulse modulation in a weather radar system for aircraft.

Another object of the invention is to provide a uniquely constructed transistorized active switch pulse modulator in which the pulse repetition frequency (PRF) and pulse duration can be readily changed. It is a feature of the invention that long pulses are limited only by storage capacitance, transformer saturation and associated magnetron limitations.

A further object of the invention is to provide a pulse modulator of the character described including a unique circuit means for controlling a transistorized switch to thereby cause the voltage source drive to a magnetron to appear similar in nature to a functionally desirable current source drive.

A further object of the invention is to provide a pulse modulator of the character described which utilizes a magnetron wherein a pulse ripple is quite low and wherein pulse slopes are regulated by a unique feedback loop to maintain a desired sinusoidal frequency spectrum.

A still further object of the invention is to provide a transistorized switch with a step up transformer driving a magnetron in the pulse modulator for weather radar. It is a feature of the invention that the modulator does not incorporate the use of critically tuned elements such as pulse forming networks and matching transformers. Further, should the magnetron fail to oscillate (fire) on a given pulse thus appearing as an open circuit, the applied voltage will not double as in other forms of pulse modulators and the danger of arcing throughout the pulse modulator is thereby obviated.

Another object of the invention is to provide a unique circuit means for protecting circuit components utilized in the pulse modulator portion of weather radar equipment. It is a feature of the invention that large current build ups caused by arcing in the magnetron are prevented by effective use of this circuit means.

These and other objects will appear in the course of the following description.

DETAILED DESCRIPTION OF THE INVENTION

In the accompanying drawings, which form a part of the specification and are to be read in conjunction therewith, and in which like reference numerals are employed to indicate like parts in the various views:

FIG. 1 is a block diagram detailing the operation of a typical weather radar system;

FIG. 2 is a block diagram showing the operation of the pulse modulator portion of a weather radar transmitter;

FIG. 4 is the right hand portion of the detailed circuit diagram shown in FIG. 3.

Figure 3:
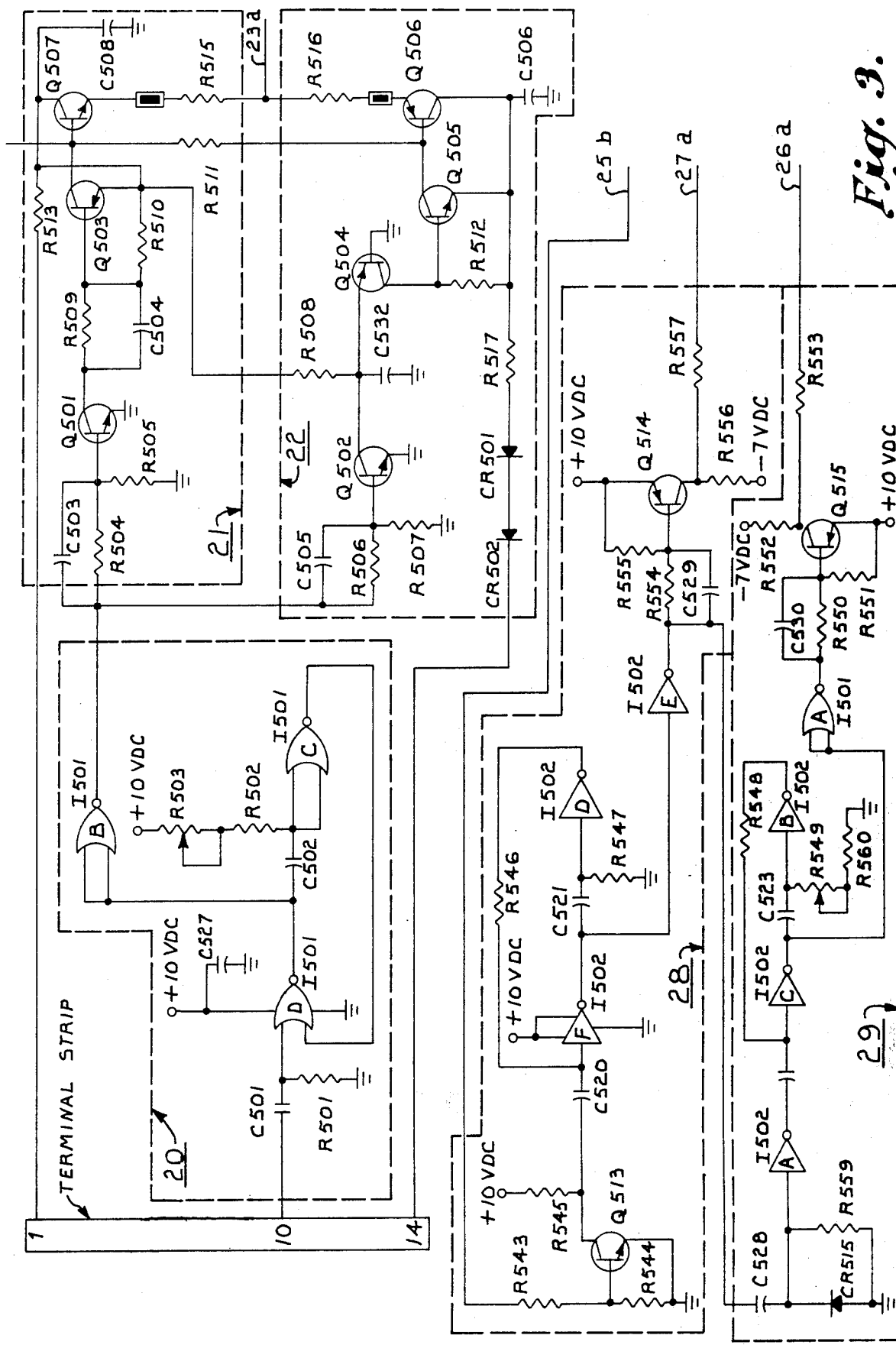
FIG. 3 is a more detailed circuit diagram of the left hand portion of the pulse modulator shown in FIG. 2.

Turning now more particularly to the drawings, the transistorized switch pulse modulator is shown in block diagram form in FIG. 2. As mentioned above, the pulse modulator forms a portion of the transmitter 10 for the weather radar system that was described with respect to FIG. 1. The trigger input to the modulator is applied to a variable monostable multivibrator or one shot circuit identified by the numeral 20. This conventionally operated circuit utilizes the potentiometer 20a to control the output pulse width of the multivibrator so that the trigger input zero to one going transition may be transformed into a pulse which will eventually be used to control the width of the RF pulse from the magnetron and as such may be varied depending upon the application. It has been found convenient to set the output pulse to a three microsecond duration, but may be varied from approximately 1 to 5 microseconds.

The output of the one shot multivibrator 20 is applied to an active pull up and active pull down circuits 21 and 22, respectively. These two circuit networks (as will be seen in FIG. 3) comprise a series of transistors which, in one instance (the pull up circuit) operates to provide a very large positive going current coincidental with the leading edge of the transmitter pulse with the active pull down network providing a very large negative going current to shut off the trailing edge of the transmitter pulse. These two networks (21 and 22) drive the network referred to as the magnetron drive circuit 23 which will also include a bifilar wound transformer and the transistor switch circuit. As will be seen, the switch is abruptly turned ON-OFF with the leading and trailing edges of the input pulses from the pull up-pull down circuits. Furthermore, the bifilar wound step up transformer provides the required voltage output to magnetron 24 in order to properly drive same and to achieve an output in the range of 9.375 gigaHz. It should be noted that this transformer will be a linear step up transformer that is not a saturating or tuning transformer, thereby eliminating certain internal reactance problems.

In the above-mentioned description, it has been indicated that a transistorized driver and step up transformer actually presents a voltage source to the magnetron. However, when the magnetron fires a current source is really desired. Accordingly, the slope control circuitry which will be described later operates to control the voltage applied to the transistor switch in such a way that it performs in the manner of a current source thereby providing the magnetron with its desired type of drive.

As further seen in FIG. 2, the above-mentioned slope control circuit will include a pulse current detector 25 that is connected via line 25a with the magnetron driver. The pulse current (to be utilized in the slope processing circuit) is detected therein but with the output of the detector 25 actually being a voltage pulse having the same shape as the current pulse input to magnetron 24. In any event, this output (25b) is delivered to a positive integrator 26, to a negative integrator 27, and to a multivibrator 28. The negative integrator is the first to function in that it operates to integrate the detected pulse during approximately the first 1 microsecond duration of the pulse. It is gated ON by a monostable multivibrator 28 for the first microsecond portion of the pulse. The negative integrator is then turned off and the positive integrator 26 turned on by a variable monostable multivibrator 29 that is driven by the multivibrator 28. Therefore, with the cessation of the negative integration, the positive integration is begun on the second 1 microsecond portion of the detected pulse. This second integration is likewise gated off after 1 microsecond. The outputs of the integrators are summed together in summer circuit 30 and will be equal and opposite if the current pulse was properly flat. If the slope on the detected current pulse to magnetron 24 is either positive or negative, a corresponding error signal will result since the two integrator outputs are unequal. When the error signal results, it is coupled to a current regulator 31 which operates to make minute current adjustments to flatten the current pulse to the magnetron. In other words, the purpose of the above-described loop is to maintain a pulse input to the magnetron with a zero slope on the peak thereof.

In the actual operation, the positive integrator and negative integrator maintain a constant voltage at the summing junction 30 when the slope of the current pulse to the magnetron remains flat on the top. If the slope is positive, the voltage decreases. Likewise, if the slope is negative the voltage increases. This voltage level (the increase and the decrease) operates to control the current regulator so that a desired average current is applied to a capacitor in the magnetron driver circuit 23 at all times. Every time the magnetron fires, there is a controlled voltage on this capacitor so that the circuit, operating as a whole loop, will produce a flat current pulse into the magnetron. If the slope is either positive or negative on the current pulse, the integrators 26 and 27 detects it, varies the amount of average current (applied to the capacitor), and in turn varies the amount of voltage stored on the capacitor at the next pulse. Therefore, the slope of the magnetron current pulse is constantly adjusted where appropriate. The correction has a very slow time constant (in the order of seconds) as set by the loop gain. In this case, if regulation were attempted too quickly, very narrow noise spikes could adversely affect the current pulse. The circuit is not limited to this response time, but could be designed for a much faster or slower response as necessary.

The gate 32 is controlled by the active pull-up circuit 21 and interconnects with the 400 volt DC power supply 50 and the magnetron driver 23. This gate (32) permits the 400 volts through the current regulator to be applied to the magnetron driver circuit 23 only when a trigger signal is inputted to the modulator. Gate 32 precludes an initial large voltage build up on the modulator driver during heater warmup in the magnetron and prior to application of the trigger input. This gives a desirable low value initial pulse from the pulse modulator which then slowly builds up, reducing the possibility of arcing in the magnetron.

In the event of an arc in the magnetron (sensed as an over current in the transistor switches), the crow bar circuit provides a means for shorting the 400 volts to ground and dumping the charge stored in the capacitor in the magnetron driver circuit. The over current detector 34 measures the emitter current in the transistor switches (Q-508, Q-509 and Q-510 described later) and fires an SCR if it exceeds a preselected value. This firing of the SCR causes the crowbar circuit 33 to activate and rapidly draws the energy from the storage capacitor.

The combined circuitry represented by FIGS. 3 and 4 shows the block diagram of FIG. 2 in a more detailed form. For example, the variable monostable multivibrator which receives the trigger input on pin 10 is included in the integrated circuit comprising the NOR gates I-501 (B, C and D) with the variable potentiometer identified by the numeral R-503. The adjusting of the resistor R-503 changes the RC time constant so that the output pulse width is variable. The output from the multivibrator 20 (the output from NOR I-501 B) is directed to the active pull up and pull down circuits described above. The active pull up circuit is comprised of the transistors Q-501, Q-503 and Q-507, while the pull down circuit includes transistors Q-502, Q-504, Q-505 and Q-506, with the associated resistors, capacitors and diodes.

The magnetron driver indicated by the numeral 23 (FIG. 4) accepts the output from the pull up and pull down circuits (via line 23a) and is comprised of the parallel transistors Q-508, Q-509 and Q-510. These transistors are arranged with their bases and collectors electrically tied together. A small emitter resistor is connected to each transistor to balance the current condition there between. These three transistors operate in parallel to drive a conventional nonsaturating transformer T-501, which in turn drives the magnetron.

When the transistors Q-508, Q-509 and Q-510 are initially turned on, due to the positive drive from the active pull up circuitry, the voltage on the secondary of transformer T-501 will rise very rapidly in proportion to the turning on of the switching transistors. No current will flow on the secondary of the transformer at this time because the magnetron appears to be an open circuit until its applied voltage virtually reaches its operating voltage.

As will be seen, the addition of capacitor C-515 precludes certain undesirable effects from occurring. For example, without capacitor C-515, when the transformer secondary voltage reaches a preselected level where the magnetron would start drawing current, a very sharp increase in current to the magnetron from the transformer would cause the transformer secondary voltage to drop slightly (due to leakage inductance) with a corresponding large drop in the magnetron current. Since the purpose of the pulse modulator is to produce a very square (with a flat top) current pulse, the leakage inductance in the transformer and the abrupt increase in current would make it virtually impossible to produce a pulse having the requisite shape. By the utilization of capacitor C-515, an effect is produced where the voltage in the secondary of the transformer starts increasing and forces the current to flow in capacitor C-515. Therefore, when the secondary voltage reaches the point where the magnetron starts drawing current, the current in capacitor C-515 is equal to the desired current flow in the magnetron. When the magnetron starts drawing current it stops the voltage from increasing which, in turn, stops the current in capacitor C-515. Therefore, there is no change in the transformer current resulting from the beginning of current flow in the magnetron. Stating, the above another way, at a preselected voltage, the magnetron abruptly starts drawing current which halts the rapid voltage rise. Capacitor C-515 no longer draws current and an automatic switching action takes place in that the current to capacitor C-515 ceases at the instant when the current in the magnetron starts so that there is no current transient in the transformer at this time. The current in the secondary of the transformer will rise from zero as the voltage rises and continue until the magnetron fires (normally in this instance around 3 amps) switching the current from the capacitor C-515 to the magnetron. The sudden drawing of 3 amps by the magnetron is therefore not recognized by the transformer T-501 so that it is possible, through the combined use of the capacitor and transformer, to provide a load to the transformer prior to the conduction level of the magnetron. Without the capacitor, there would be an open circuit on the secondary of the transformer. However, if current is flowing into capacitor C-515 below the threshold of the magnetron, then the current can be smoothly switched thereto at the appropriate time.

The above-described feature facilitates the utilization of a transistorized switch with a basically non-resonant design for a pulse modulator. The capacitor C-515 does not act to resonate but merely to force current flow in the transformer so that when the magnetron starts drawing current no adverse transient will appear in the transformer. As a result, a practical rather than an ideal transformer may be utilized in the modulator circuit.

It should be noted that the circuit operates to provide a similar effect occurring at the end of the current pulse. At this point in time, transistors switches Q-508, Q-509 and Q-510 turn off. The voltage in the secondary of transformer T-501 begins to decrease. When the secondary voltage has decreased only slightly, the magnetron abruptly turns off. As a practical matter, the transformer T-501 has 3 amps flowing in its secondary at about 3500 volts when the secondary load of same is suddenly open circuited. In order to dissipate the energy stored in the transformer core and prevent damage to the transformer and associated components, a circuit comprising R-532, SCR Q-521, capacitor C-516, diode CR-507 and R-533 is utilized. As the voltage at the collector of the three switching transistors starts to rise (which occurs at the end of the pulse turning the magnetron off), diode CR-507 becomes reverse biased. Capacitor C-516 holds the cathode of the SCR Q-521 virtually at ground (same being pulled there through diode CR-507 when the transistors were turned on). The rising collector voltage is then applied through R-533 to the gate of the SCR. This turns the SCR on which applies a resistance of R-532 across the primary transformer T-501. Therefore, with the switching transistors having turned off, the following occurs: the primary of the transformer is open circuited, the voltage on the secondary has dropped slightly; the magnetron has turned off which in turn open circuits the secondary of transformer T-501. At the same time, Q-521 is turned on applying the resistive load R-532 to the primary of the transformer T-501 which permits the dissipation of the energy therein. The transformer voltage then drops rapidly to zero which is desirable for the magnetron.

The gate circuit 32 discussed with respect to FIG. 2 provides at least two functions and is actually physically separated as shown in FIG. 4. Primarily, the gate circuit precludes the 400 volts from reaching the switching transistors Q-508, Q-509 and Q-510 unless a trigger is applied to the modulator. For example, gate circuit will include the SCR Q-522 (upper portion) and the field effect transistor Q-516 and related circuitry (lower left hand portion). Transistor Q-516 and its related circuitry causes the current regulator circuit (31) to start at its lowest voltage level to the transistors.

When the trigger signal is not inputted to the modulator, transistor Q-516 is on and applying 10 volts to another field effect transistor Q-517 which forms a portion of the current regulator 31. As a result, the current regulator assumes its lowest current level and provides yet another protective feature with respect to initializing the magnetron. As the trigger is inputted to the modulator, the driving network to field effect transistor Q-516 turns off same and the normal slope regulation described above can continue. With the field effect transistor Q-516 being off, it does not interfere with the summed output of the positive and negative integrators 26 and 27, repsectively, at summing point 30.

The positive integrator 26 mentioned above is comprised of a transconductance operational amplifier I-504 while the negative integrator 27 includes the transconductance operational amplifier I-503. The two outputs from the amplifiers are tied directly together (since they are current outputs indicating high impedance points) and are summed in capacitor C-519 at summing junction 30.

When power is initially applied to the radar, a heater voltage is first put on the magnetron (note the heater voltage pins 12 and 38 in FIG. 4). After a "time out" that allows the magnetron to warm up or during the warm up period, the gate circuit 32 is forcing the slope regulation loop to be at its lowest value which is essentially in the "turn off" condition. The capacitor C-511 at this time is storing energy for pulse production during the operating stage and in the subject invention could have between 200 and 300 volts thereupon due to a low charging current allowed to bypass Q-522 through R-564. Also, at this time, the current regulator circuit 31 is turned off so that the zener diode CR-513 is conducting with approximately a −82 volts thereon. the potential difference between the 400 volt supply and the −82 volts is 318 volts relative to ground that appears on the input to the gate circuit 32 via the line 32a.

When the magnetron is sufficiently warm and the pulse modulator trigger is applied, the field effect transistor Q-516 turns off and its effect on the summing junction 30 (capacitor C-519) is negated. SCR Q-522 in the upper portion of the gate circuit turns on thereby allowing the capacitors C-511 in the magnetron drive circuit 23 to receive significant charging current. At this time, the trigger input is being applied to the modulator so that the three transistor switches Q-508, Q-509 and Q-510 are turning on and producing relatively low level pulses to the magnetron 24. The circuit has been designed so that the pulses will cause the magnetron to fire but at a low level. As the magnetron fires, current pulses are sensed by the pulse current detector 25 (resistor R-540) and are fed to the positive and negative integrators (26 and 27) which starts changing the voltage on capacitor C-519 (summer 30) from 10 volts (where it was forced to during initial warm up period) down towards some control voltage level. As this voltage decreases, the current regulator 31 (transistors Q-517 and Q-518) turns on allowing more current to flow into capacitor C-511 increasing the voltage on C-511 and causing the current pulse to become more flat (e.g. from a sharp negative slope to a more square slope). This action continues around the loop through the positive and negative integrators to adjust the voltage on C-519 (summing point 30) and further adjusting the current regulator. The end result is that the amount of current applied to capacitor C-511 is varied until a flat slope on the current pulse to the modulator is achieved. As may be seen, this circuit operates to take a basic voltage drive (in the form of a transformer and transistor switch) to the magnetron and cause it to perform as a current drive in such a manner that the current pulse to the magnetron can be controlled by controlling the voltage in the manner described.

Turning now once again to the positive and negative integrators 26 and 27 and the associated gates utilized therewith, the resistor R-549 (FIG. 3) with its associated tap provides an adjustable setting for regulating the slope of the current pulse. The value of this resistance (R-549) changes the pulse width at the gating network which is applied to the positive integrator I-504 and permits the cancelling effects of the ripple on the regulating loop and will also compensate for slight mismatches in the gains of the two integrators thereby permitting the regulating loop to achieve a square current pulse. As shown, the adjustable multivibrator circuit and the variable element (resistor R-549) is comprised of the integrated circuits shown within the dash lines in FIG. 3 and identified by the numeral 29 and includes the NOR gate 501 A, the transistor Q-515 and inverter I-502 A, B and C. The circuitry directly above and within the broken lines identified as 28 comprise the fixed monostable multivibrator and includes the disclosed integrated inverter circuits I-502 D, E and F and transistor Q-514, Q-513. Finally, the pulse current detector 25 comprises resistor R-540 (FIG. 4).

As suggested above, the capacitor C-515 and secondary of the step up transformer T-501 play a significant role in the slope of the current pulse to the magnetron in that a flat slope may appear at various current levels but the operating condition on the magnetron will not be varied significantly. The power output from the magnetron and the frequency are not significantly affected so that for a particular value of capacitor C-515, the resistive potentiometer R-549 may be adjusted to produce a flat slope accommodating component variances by a simple and easy potentiometer adjustment.

The crowbar circuit mentioned above with respect to the overall operation of the system shown in FIG. 2, is shown in more detail in FIG. 4. When the magnetron arcs, high current will appear on the switching transistors Q-508, Q-509 and Q-510. The resistors R-522, R-523 and R-524 form a voltage divider so that the voltage applied to the base of transistor Q-511 is just below its turn on value. Accordingly, when the voltage on the emitter of the switching transistor Q-508 exceeds "turn on" through the resistor R-522 and the other voltage dividers resistors, the transistor Q-511 turns on which also turns on transistor Q-512 and eventually the SCR Q-520. The zener diode CR-504 operates to assure that the base of the transistor Q-512 does not go below a specified voltage (in this case 3.3 volts). With the transistor Q-511 turning on transistor Q-512 and with current flowing from the 10 volt DC supply through the resistor R-526, a positive signal is eventually applied to the gate terminal of the SCR Q-520 which turns on same. The zener diode CR-504 prevents the base of transistor Q-512 from essentially being at ground when the transistor Q-511 is turned on. In any event, with the SCR Q-520 turned on shorting its anode to cathode, resistor R-528 (a 1½ ohm resistor) is connected across the capacitor C-511 via lines 63, 64, 65, 66 and 67. This results in the very rapid discharging of C-511 (within a few microseconds). In this fashion, the magnetron arcing is sensed and the capacitor discharged before any adverse effects could be experienced in the associated transformer or in the overall system.

It should be noted that the entire system is also turned off when the SCR Q-520 is gated on. The voltage divider formed by resistors R-538 and R-539 effect the turning off of the power supply to the system for a preselected time period by conventional gating circuitry (not shown) connected with pin 7 in the FIG. 4 terminal strip.

From the foregoing, it will be seen that this invention is one well adapted to attain all of the ends and objects hereinabove set forth, together with other advantages which are obvious and which are inherent to the structure.

It will be understood that certain features and subcombinations are of utility and may be employed without reference to other features and subcombinations.

As many possible embodiments may be made of the invention without departing from the scope thereof, it is to be understood that all matter herein set forth or shown in the accompanying drawings is to be interpreted as illustrated and not in a limiting sense.

Having thus described our invention, we claim:

1. In the modulator portion of a transmitter for a weather radar system utilized in aircraft, the improvement comprising:
   a trigger input to said modulator,
   an RF pulse producing means,
   means for driving said RF pulse producing means in accordance with said trigger input,
   circuit means interconnecting said trigger input with said pulse producing means,
   said driving means being operable to drive said RF pulse producing means with a pulse signal,
   means interconnected with said driving means for controlling the slope of said pulse signal utilized in driving said RF pulse producing means,
   said slope controlling means including a pulse current detector circuit connected with said driving means,
   integrator means interconnected with said detector circuit for producing a signal corresponding to the slope of said pulse signal utilized in driving said RF pulse producing means, and
   means interconnecting said integrator means and said driving means to control said driving in accordance with the signals from said integrator means.

2. The combination as in claim 1, wherein said integrator means includes a positive integrator and a negative integrator interconnected with said pulse current detector, said pulse current detector including means for producing an output voltage pulse having the same shape as the input pulse signal to said RF pulse producing means, said positive and negative integrators being operable to integrate certain portions of said output voltage pulse and said integrator interconnecting means being operable to determine the slope of said voltage pulse from said integrator output.

* * * * *